(12) United States Patent
Bushner

(10) Patent No.: US 8,266,390 B2
(45) Date of Patent: *Sep. 11, 2012

(54) SYSTEM AND METHOD FOR PROVIDING ONE-TIME PROGRAMMABLE MEMORY WITH FAULT TOLERANCE

(75) Inventor: Paige Bushner, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 893 days.

This patent is subject to a terminal disclaimer.

(21) Appl. No.: 11/435,028

(22) Filed: May 16, 2006

(65) Prior Publication Data

US 2006/0206672 A1   Sep. 14, 2006

Related U.S. Application Data

(63) Continuation of application No. 10/199,206, filed on Jul. 19, 2002, now Pat. No. 7,047,381.

(51) Int. Cl.
*G06F 13/26* (2006.01)
(52) U.S. Cl. ........................................................ 711/153
(58) Field of Classification Search .................. None
See application file for complete search history.

(56) References Cited

U.S. PATENT DOCUMENTS

| | | | |
|---|---|---|---|
| 5,027,317 A | 6/1991 | Pepera et al. | |
| 5,844,910 A | 12/1998 | Niijima et al. | |
| 6,011,734 A * | 1/2000 | Pappert | 365/200 |
| 6,144,593 A * | 11/2000 | Cowles et al. | 365/200 |
| 6,219,282 B1 | 4/2001 | Tanaka | |
| 6,295,591 B1 * | 9/2001 | Bealkowski et al. | 711/165 |
| 6,504,770 B2 * | 1/2003 | Kitsukawa et al. | 365/200 |
| 6,658,438 B1 * | 12/2003 | Moore et al. | 1/1 |
| 6,731,550 B2 * | 5/2004 | McClure | 365/200 |
| 2003/0014687 A1 | 1/2003 | Wu | |
| 2003/0115518 A1 * | 6/2003 | Kleveland et al. | 714/718 |
| 2003/0154437 A1 * | 8/2003 | Chih | 714/763 |
| 2003/0226006 A1 * | 12/2003 | Ballard | 713/1 |

OTHER PUBLICATIONS

Design for test for digital IC's and embedded core systems. Alfres L Crouch, Prentice Hall PRT Mar. 2000.*

* cited by examiner

*Primary Examiner* — Duc Doan
(74) *Attorney, Agent, or Firm* — Thomas, Kayden, Horstemeyer & Risley, LLP

(57) ABSTRACT

Systems and methods that provide a one-time programmable (OTP) memory with fault tolerance are provided. In one example, the OTM memory may include a data portion and a multistage programming (MSP) portion. The data of the data portion may be protected by error coding. The MSP portion may include at least one MSP bit and at least one respective redundant MSP bit.

28 Claims, 4 Drawing Sheets

FIG. 2

ARRAY 0

| B 7,6 | B 5,4 | B 2,1 | B 3 | B 0 | | | | | |
|---|---|---|---|---|---|---|---|---|---|
| | | | REDUNDANT COLUMN | TEST COLUMN | | | | | |
| 1B | E | 0 | | | ... | REDUNDANT ROW | REDUNDANT ROW | ... | MSP[6:0] | MSP[13:7] | TEST ROW |

| INT | 00 | 01 | ... | 10 | 11 | ... | 1D | 1E | 1F |
| EXT | 00 | 01 | ... | 10 | 11 | ... | 1D | 1E | 3F |

ARRAY 1

| B 7,6 | B 5,4 | B 2,1 | B 3 | B 0 |
| | | | REDUNDANT COLUMN | TEST COLUMN |
| 1B | 0 | E | ... | REDUNDANT ROW | REDUNDANT ROW | ... | REDUNDANT MSP[6:0] | REDUNDANT MSP[13:7] | TEST ROW |

| INT | 00 | 01 | ... | 10 | 11 | ... | 1D | 1E | 1F |
| EXT | 20 | 21 | ... | 30 | 31 | ... | 3D | 3E | 3F |

SYSTEM AND METHOD FOR PROVIDING ONE-TIME PROGRAMMABLE MEMORY WITH FAULT TOLERANCE

This application is a continuation of U.S. patent application Ser. No. 10/199,206, filed on Jul. 19, 2002 now U.S. Pat. No. 7,047,381, which is hereby incorporated herein in its entirety by reference.

BACKGROUND OF THE INVENTION

A one-time programmable (OTP) memory may be used to provide additional security for the data stored in the OTP memory. Once a bit in an OTP memory is programmed, for example, from a binary zero to a binary one, then that particular bit typically cannot be programmed again.

Data stored in the OTP memory may also be protected with error codes. For example, a cylindrical redundancy checking (CRC) code may be used for error detection and a Hamming code may be used for error correction. Thus, the data, possibly several Hamming codes and one CRC code are then all stored in the OTP memory. Each Hamming code is a function of a portion of the data stored in the OTP memory. The CRC code is a function of the data and the Hamming codes stored in the OTP memory.

The conventional OTP memory may have one or more of the following disadvantages. For example, information stored in the OTP memory is inflexible since the data cannot be changed. A change in one bit that is covered by a Hamming code is corrected by the Hamming code. Thus, the change in the one bit has no effect. In addition, a change in one bit that is covered by the CRC code changes the CRC code, which may be interpreted as evidence of tampering by the OTP memory. Thus, if the data is protected by an error code, then the data cannot be modified.

Further limitations and disadvantages of conventional and traditional approaches will become apparent to one of ordinary skill in the art through comparison of such systems with aspects of the present invention as set forth in the remainder of the present application with reference to the drawings.

BRIEF SUMMARY OF THE INVENTION

Aspects of the present invention may be found in, for example, systems and methods that provide one-time programmable (OTP) memory with fault tolerance. In one embodiment, the present invention may provide the OTP memory including a data portion and a multistage programming (MSP) portion. The data of the data portion may be protected by error coding. The MSP portion may include at least one MSP bit and at least one respective redundant MSP bit.

In another embodiment, the present invention may provide an OTP memory including a first memory portion and a second memory portion. The first memory portion may include data values that cannot be changed after an initial programming cycle. The second memory portion may include data values that can be changed in programming cycles after the initial programming cycle. The second memory portion may be adapted to provide a fault tolerant scheme.

In yet another embodiment, the present invention may provide a method that provides an OTP memory with fault tolerance. The method may include the steps of programming a first memory portion of the OTP memory in an initial programming cycle, the first memory portion being locked in its values after the initial programming cycle; programming at least a part of a second memory portion with particular values in a programming cycle after the initial programming cycle; and programming at least a corresponding part of a redundant portion of the second memory portion with the particular values.

These and other features and advantages of the present invention may be appreciated from a review of the following detailed description of the present invention, along with the accompanying figures in which like reference numerals refer to like parts throughout.

BRIEF DESCRIPTION OF THE DRAWINGS

FIG. 2 shows an example of memory arrays according to one embodiment of the present invention.

DETAILED DESCRIPTION OF THE INVENTION

Figure 1:
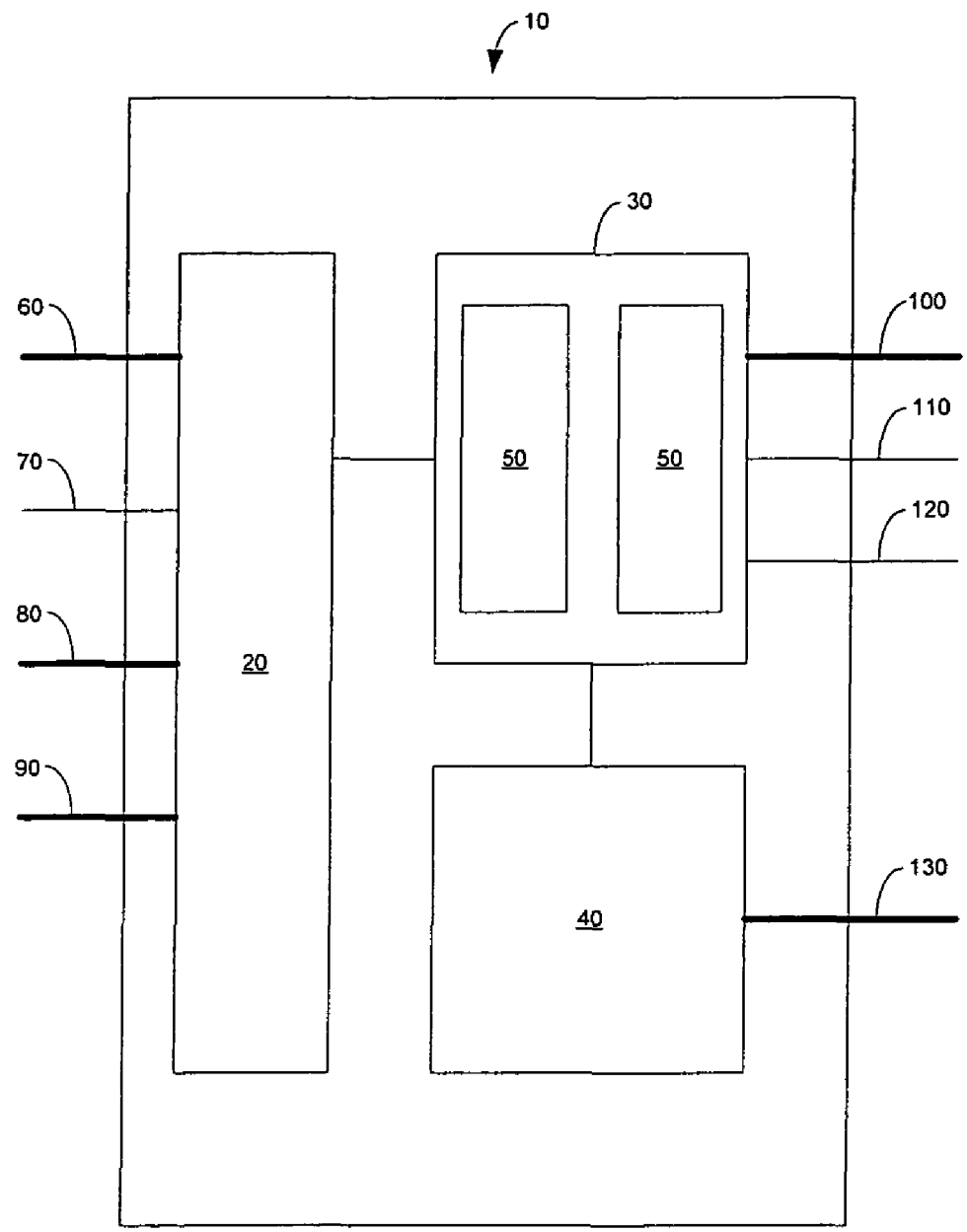
FIG. 1 shows a block diagram illustrating an example of a one-time programmable (OTP) memory according to one embodiment of the present invention.

FIG. 1 shows a block diagram illustrating an example of a one-time programmable (OTP) memory according to the present invention. The OTP memory 10 may include, for example, an interface module 20, a storage module 30 and a multistage programming (MSP) module 40. The storage module 30 may include, for example, a plurality of OTP memory arrays 50. The interface module 20 may be coupled to the storage module 30. The storage module 30 may be coupled to the MSP module 40.

The OTP memory 10 may have inputs and outputs. For example, the OTP memory may include a program mode input bus 60, a data input line 70, a bit input bus 80 and an address input bus 90. The program mode input bus 60, the data input line 70, the bit input bus 80 and the address input bus 90 may be coupled to the interface module 20. The OTP may include a data output bus 100, a data done line 110, a data valid line 120 and an MSP output bus 130. The data output bus 100, the data done line 110 and the data valid line 120 may be coupled to the storage module 30. The MSP output bus 130 may be coupled to MSP module 40.

The memory arrays 50 may include a data portion and MSP bits according to the present invention. The data portion may include, for example, data and error coding that are programmed into the memory arrays 50 during an initial programming cycle. The MSP bits may include individual bits which may be programmed individually or in sets. The MSP bits may be programmed during the initial programming cycle or at possibly different times during subsequent programming cycles. The data portion of the memory arrays 50 may include software coding (e.g., error coding) and hardware implementations (e.g., redundant rows) to provide fault tolerance for data that may not be changed. The MSP bits of the memory arrays 50 may include hardware implementations (e.g., duplicate bits) to provide fault tolerance for data that may be programmed during or subsequent to the initial programming of the memory arrays 50. Both the data portion and the MSP bits may provide fault tolerance by allowing a limited number of bits to be remapped or to be duplicated in the memory arrays 50 to other array locations. This allows some defects to exist within the memory arrays 50 while allowing the data within the data portion and the MSP bits to remain fully functional.

In operation, the program mode input bus 60 carries signals that determine a mode of operation for the OTP memory 10. For example, a first mode of operation may be the initial programming of the data portion of the memory arrays 50; a second mode of operation may be the programming of the MSP bits; a third mode of operation may be the reading of particular contents of the memory arrays 50. The particular mode of operation may be determined, for example, in the interface module 20.

In the first mode of operation, the data portion of the memory arrays 50 may be initially programmed to include the data and the error codes such as, for example, the error detection codes or the error correction codes according to an embodiment of the present invention. In one example, once the data portion of the memory arrays 50 are programmed, the values cannot be changed since the error detection codes and error correction codes cannot be changed. In one example, the data portion is programmed bit by bit via the data input line 70. Each bit value carried by the data input line 70 also has a corresponding bit address carried on the bit input bus 80 and a corresponding row address carried on the address input bus 90. The interface module 20 may also include an address generator which may generate an internal address in the memory arrays 50 for a particular external address. In one example, the external row address received on the address input bus 90 is converted to an internal row address in one of the memory arrays 50.

In the second mode of operation, the MSP bits of the memory arrays 50 may be programmed, for example, individually or in sets according to an embodiment of the present invention. The MSP bits may be programmed during the initial programming cycle or at possibly different times after the initial programming cycle. In one example, wherein the first mode of operation may occur in a manufacturing site, the second mode of operation may occur, for example, in the field (e.g., at the customer site). Thus, where the OTP memory 10 is used to configure a device (e.g., a set top box), the MSP bits can activate or deactivate particular features in the device at any time. One or more of the MSP bits of the memory arrays 50 can then be programmed individually or in sets to activate or deactivate particular features in the device. The memory arrays 50 may also provide a hardware implementation for fault tolerance. In one example, an MSP bit may be programmed in one of the memory arrays 50; and then a corresponding redundant MSP bit in the other of the memory arrays 50 may also be programmed. Thus, the desired feature is either activated or deactivated in the device if at least one of the MSP bit or the corresponding redundant MSP bit was successfully programmed. In addition, the MSP module 40 continuously provides the MSP bit values on the MSP output bus 130 after the OTP memory 10 is powered up. Thus, accessing the MSP bit values differs from accessing information stored in the data portion of the memory arrays 50 in that the MSP bit values are always accessible via the MSP output bus 130.

In the third mode of operation, the memory arrays 50 may be accessed for reading according to an embodiment of the present invention. In one example, although the data is input bit by bit, the data is read out byte by byte. Thus, a read address may include a byte address which may be carried on the address input bus 90. The interface module 20, which receives the read address, then generates the corresponding bit and row addresses in the memory arrays 50. In one example, a typical byte address is spread over locations in the memory arrays 50 so that information may be accessed and read out in parallel. Once the particular locations in the memory arrays 50 corresponding to the byte address are read out, then the byte of information is carried on the data output bus 100.

FIG. 2 shows an example of the memory arrays 50 (i.e., array 1 and array 0) according to an embodiment of the present invention. In one example, each array 50 may be a 32×8 array. The arrays 50 may act as a single memory when viewed from an external point of view (e.g., by a customer). Thus, an external address may be used to generate an internal address in the arrays 50. For example, during an initial data input, an external address (e.g., supplied by the customer or by an external device) may be translated into an internal address. For example, the external address 20 in hexadecimal may be translated into internal address 00 of array 1. Thus, from the point of view of the customer or the external device, the OTP memory acts as a single storage module 30.

Each array 50 may include a test column, a redundant column, at least one redundant row, and a test row. In one example, each array 50 may include two redundant rows. In another example, the two redundant rows and the redundant column are provided in the hardware in areas of low fault density. The middle rows (e.g., internal row addresses 10, 11) and the middle column (bit 3) may contain areas of low or lowest fault density and may provide positions for the redundant rows and the redundant column, respectively. One of the arrays (e.g., array 0) may have MSP bits and another of the arrays (e.g., array 1) may include redundant MSP bits. In one example, one of the arrays has two MSP rows and a total of 14 MSP bits and another of the arrays has two redundant MSP rows and a total of 14 redundant MSP bits.

To test for a defective memory array 50, each of the memory arrays 50 includes a test column and a test row. In one example, the test column and the test row may be positioned in areas with high fault density. The edges of the memory array 50 may contain the highest fault density. A fault may be, for example, an event in which a misprograminging has occurred or may be an event in which a reversion has occurred (e.g., a programmed binary one reverts back to a binary zero). Faults have many causes including, for example, physical defects in the physical chip. Since the edges of the memory array 50 may include the highest fault density, the test column and the test row are positioned at the outermost edges. Thus, in array 1, the test column is in the bit 0 (i.e., B 0) column and the test row is in the internal row address 1F. During testing, the test column and the test rows are programmed (i.e., programmed to binary ones). If the test column and the test row cannot be successfully programmed and verified, then the memory array is deemed defective. If the test column and the test row can be successfully programmed and verified, then the memory array has a high probability of being fault free and a status bit is programmed (i.e., set high). In one example, each memory array 50 may include the status bit at bit 0 of internal row address 11.

In operation, during the initial programming cycle of the data portion of the memory arrays 50 according to an embodiment of the present invention, a memory array 50 is written one row at a time and bit by bit. In one example, referring to array 0, internal row address 00 is written bit by bit in the following order: bit 1, bit 2, bit 4, bit 5, bit 6, bit 7. After a bit has been programmed, this event is reflected as a signal on the data done output line 110. After the value in the bit has been verified, then this event is reflected as a signal on the data valid output line 120. If the entire row (i.e., six bits) is successfully programmed and verified, then a binary one is stored in the redundant column (bit 3 column) for that row.

However, if a fault is present in the row, for example, due to a physical defect, then a binary zero is stored in the redundant column for that row. A fault may occur if at least one of the bits in the row is not programmed successfully or is not verified. In one example, if a fault is present in the row, then the entire data previously destined for the faulty row is stored in the first available redundant row (e.g., the redundant row at internal row address 10). With a successfully programmed and verified redundant row, a binary one is stored in the redundant column for the redundant row. In one example, the fault tolerant hardware may provide two redundant rows per memory array 50. Thus, the data portion of the memory array 50 not only may benefit from error coding (e.g., error correction coding and error detection coding), but also may benefit from fault tolerance built into the hardware of the memory array 50.

During the programming of the MSP bits, one of the MSP bits can be programmed at a time. The MSP bits can be programmed during the initial programming cycle or during subsequent programming cycles. Thus, for example, MSP[i] in array 0 (i.e., the i-th most significant bit of the MSP bits) may be programmed. In one example, i is an integer from 0 to 13. To increase fault tolerance in the hardware of the memory arrays 50, redundant MSP[i] in array 1 is also programmed with the same value. If one of the MSP[i] and the redundant MSP[i] has been successfully programmed and verified, then the corresponding output on the MSP output bus 130 may reflect the intended programmed value. If, for example, one of the MSP[i] and the redundant MSP[i] is faulty, because of the redundancy, the correctly programmed and verified value will appear on the corresponding output of the MSP output bus 130. In one example, if MSP[i] is successfully programmed and verified, then redundant MSP[i] is not programmed. In another example, even if MSP[i] is successfully programmed and verified, redundant MSP[i] is programmed with a duplicate value. Programming both bits in such a situation may guard against, for example, a possibility that one of the bits may revert from a programmed state to an unprogrammed state.

During the reading of the memory arrays 50, at least two different processes may be used according to an embodiment of the present invention. In one example, a particular MSP bit may be read at any time by accessing the MSP output bus 130 at the corresponding line of the bus. The MSP output bus 130 is always accessible and provides the value stored for the MSP bits as long as the OTP memory 10 is powered. In another example, data may be read from the data portion of the memory array 50 via a read address or byte address. For example, a byte address of 0 received by the interface module 20 may be translated into bits 1 and 2 of internal address 00 in array 0 and bits 1, 2, 4, 5, 6 and 7 of internal address 00 in array 1. These bits may be read in parallel from the two arrays and the programmed values may then be carried on the data output bus 100. Thus, the data portions of the memory arrays 50 are programmed bit by bit, but data portions of the memory arrays 50 are read byte by byte. In one example, the information in the data portion is only accessible when addressed, while the information in the MSP portion is always accessible on the output bus 130.

Figure 3:
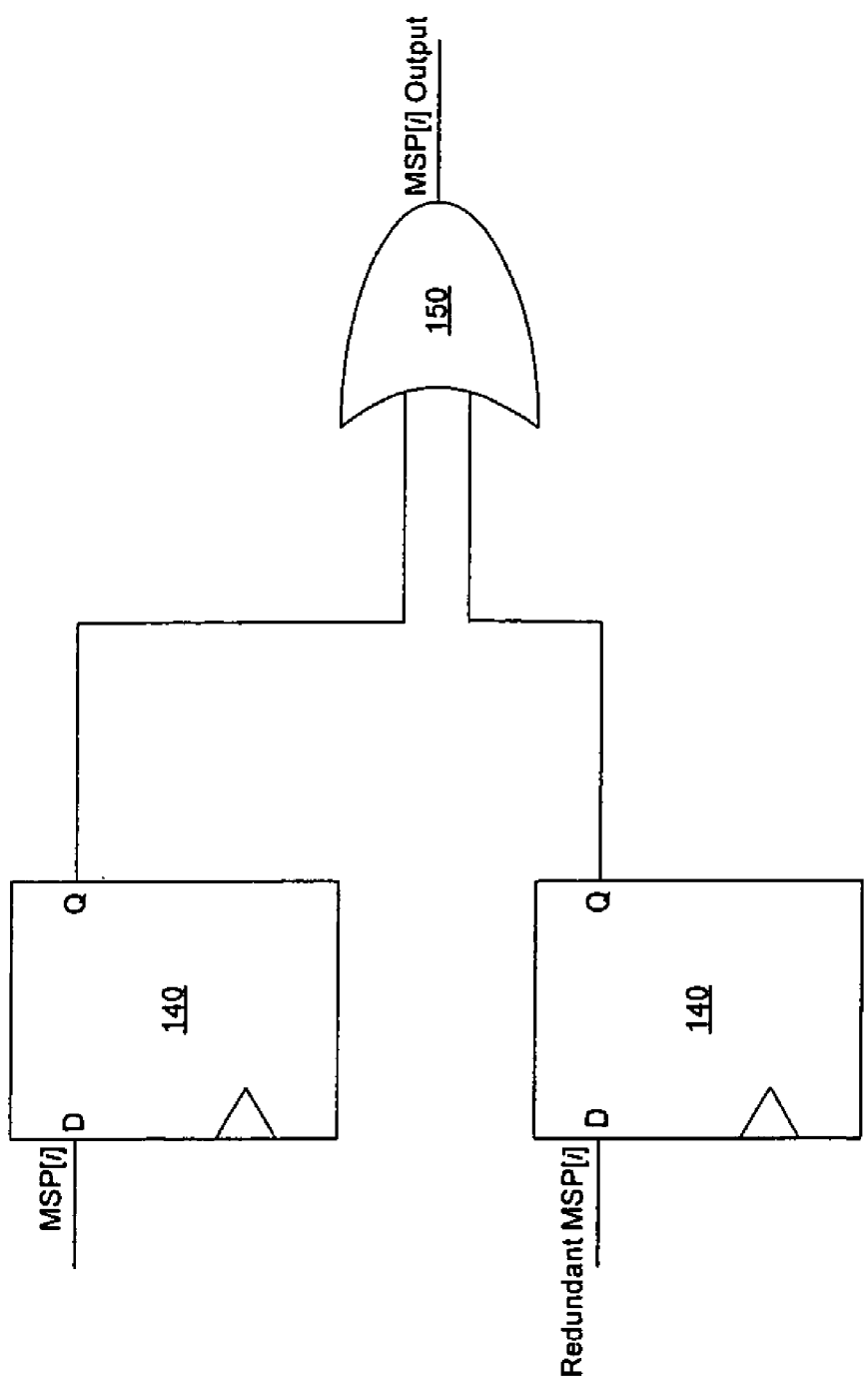
FIG. 3 shows an example of some components in a multistage programming (MSP) module according to one embodiment of the present invention.
Figure 4:
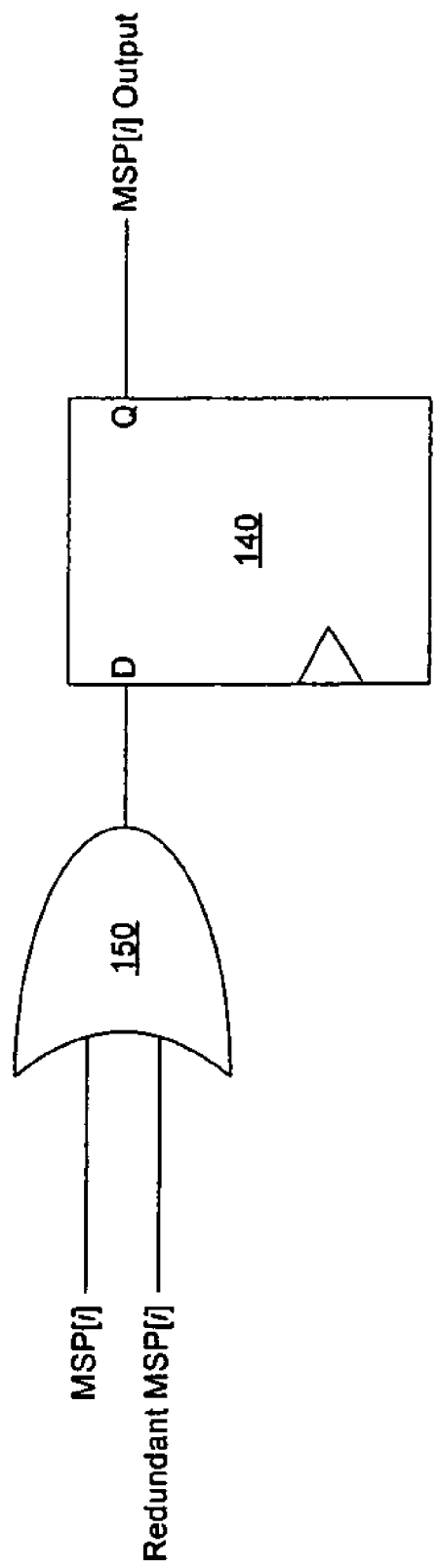
FIG. 4 shows another example of some components in an MSP module according to one embodiment of the present invention.

FIGS. 3 and 4 show examples of some components in the MSP module 40 according to embodiments of the present invention. FIG. 3 shows two flip flops 140 and an OR gate 150. Although the flip flops 140 are shown as D-Flops, the flip flops 140 may include other types or sets of flip flops. One flip flop 140 may have an input D connected to MSP[i] and the other flip flop 140 may have an input D connected to redundant MSP[i]. The outputs Q of the flip flops 140 may be connected to the inputs of the OR gate 150. The output of the OR gate 150 may be connected to the corresponding line (i.e., MSP[i] Output) of the MSP output bus 130. The MSP module 40 may include similar components for the other MSP bits and redundant MSP bits.

In operation, when the flip flops 140 are powered on, the flip flops 140 may carry their inputs (e.g., MSP[i] and redundant MSP[i]) on respective outputs. The OR gate 150 may provide that if at least one of the MSP[i] and redundant MSP[i] has been successfully programmed and verified, then the MSP[i] Output may carry the desired value of the successfully programmed and verified bit. In one example in which there may be 14 MSP bits, the outputs of 14 OR gates 150 may be providing the respective MSP[i] outputs. The 14 MSP[i] outputs may form the MSP output bus 130. Thus, all of the MSP bits are accessible at any given moment through the MSP output bus 130.

FIG. 4 shows another example of some components of the MSP module according of the present invention. The inputs of the OR gate 150 may be respectively connected to the MSP[i] of array 0 and the redundant MSP[i] of array 1. The output of the OR gate 150 may be connected to the input D of the flip flop 140. The output of the flip flop 140 may then be connected to the corresponding line (i.e., MSP[i] Output) of the MSP output bus 130. The MSP module 40 may include similar components for the other MSP bits and redundant MSP bits. Again, the output of the flip flops 140 may provide that all of the MSP bits are accessible at any given moment through the MSP output bus 130.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A one-time programmable (OTP) memory, comprising:
   a data portion comprising a plurality of data bits that are protected by error coding and are only programmable once and are programmed during an initial programming cycle; and
   a multistage programming (MSP) portion comprising:
      a plurality of MSP bits that are only programmable once and are programmed individually or in sets during another programming cycle that is different than the initial programming cycle; and
      a plurality of respective redundant MSP bits that correspond to the plurality of MSP bits that can only be programmed once.

2. The OTP memory according to claim 1, wherein the data portion is locked after the initial programming cycle, and the MSP portion remains unlocked after the initial programming cycle.

3. The OTP memory according to claim 1, wherein a value programmed into at least one of the plurality of MSP bits is always also programmed into a corresponding respective redundant MSP bit of the plurality of respective redundant MSP bits.

4. The OTP memory according to claim 1, wherein, if a value is programmed successfully and verified in at least one of the plurality of MSP bits, then the value is not programmed into a corresponding respective redundant MSP bit of the plurality of respective redundant MSP bits.

5. The OTP memory according to claim 1, further comprising a logic gate, wherein the plurality of MSP bits and the plurality of redundant MSP bits are always inputs to the logic gate.

6. The OTP memory according to claim 1, wherein the MSP output bus is utilized exclusively for outputting the information stored in the MSP portion of the OTP memory.

7. The OTP memory according to claim 1, further comprising:
a first flip flop comprising a first input and a first output, where the first input of the first flip flop is coupled to the plurality of MSP bits;
a second flip flop comprising a second input and a second output, where the second input of the second flip flop is coupled to the plurality of respective redundant MSP bits; and
a logic gate comprising a third input and a fourth input, where the third input is coupled to the first output of the first flip flop, and the fourth input is coupled to the second output of the second flip flop.

8. The OTP memory according to claim 1, further comprising:
a logic gate having a first input, a second input and an output, where the first input is coupled to the plurality of MSP bits, and the second input is coupled to the plurality of respective redundant MSP bits; and
a flip flop having an input that is coupled to the output of the logic gate.

9. The OTP memory according to claim 1, wherein the another programming cycle occurs after completion of the initial programming cycle.

10. The OTP memory according to claim 9, wherein the initial programming cycle completes upon a successful verification of a write to the data portion or upon a handling of a fault in the write to the data portion.

11. The OTP memory according to claim 1, further comprising an MSP output bus that always outputs all of the MSP bits whenever the OTP memory is powered.

12. The OTP memory according to claim 11, wherein the MSP output bus outputs all of the MSP bits without requiring a read address.

13. The OTP memory according to claim 11, wherein the MSP output bus always outputs a bit MSP[i] in the plurality of MSP bits at a corresponding line on the MSP output bus whenever the OTP memory is powered.

14. The OTP memory according to claim 6, further comprising a logic gate, wherein the plurality of MSP bits and the plurality of redundant MSP bits are always inputs to the logic gate and an output of the logic gate is a line in the MSP output bus.

15. A one-time programmable (OTP) memory device, comprising:
a first OTP memory portion comprising first bits that can only be programmed once and are programmed during an initial programming cycle; and
a second OTP memory portion comprising second bits that can only be programmed once and are programmed individually or in sets during another programming cycle that is different than the initial programming cycle, the second memory portion being adapted to provide a fault tolerant scheme.

16. The OTP memory device according to claim 15, further comprising an output bus that always outputs each value programmed into each of the second bits at a corresponding line on the output bus whenever the OTP memory is powered.

17. The OTP memory device according to claim 16, wherein the output bus outputs all of the second bits without requiring a read address.

18. The OTP memory device of claim 15, wherein the second OTP memory portion comprises a plurality of second bits and a plurality of respective redundant second bits, each of which is always dedicated to a respective one of the plurality of second bits.

19. The OTP memory device of claim 18, wherein each pair of a second bit and a respective redundant second bit is communicatively coupled to inputs of a respective logic gate, the output of which is communicatively coupled to a line of an output bus of the OTP memory.

20. The OTP memory device according to claim 15, wherein the another programming cycle occurs after completion of the initial programming cycle.

21. The OTP memory device according to claim 20, wherein the initial programming cycle completes upon a successful verification of a write to the first OTP memory portion or upon a handling of a fault in the write to the first OTP memory portion.

22. A method for providing a one-time programmable (OTP) memory with fault tolerance, the method comprising:
programming a first memory portion of the OTP memory in an initial programming cycle, the first memory portion comprising a plurality of first memory portion bits that can only be programmed once;
programming at least a part of a second memory portion comprising a plurality of second memory portion bits that can only be programmed once, with particular values individually or in sets, during another programming cycle that is different than the initial programming cycle; and
programming at least a corresponding part of a redundant portion of the second memory portion comprising a plurality of second memory portion redundant bits that can only be programmed once with the particular values.

23. The method of claim 22, wherein programming at least a corresponding part of a redundant portion of the second memory portion with the particular values comprises always programming at least a corresponding part of a redundant portion of the second memory portion with the particular values.

24. The method of claim 22, wherein:
programming at least a part of a second memory portion with particular values comprises programming a particular first value in a particular first bit of the second memory portion; and
programming at least a corresponding part of a redundant portion of the second memory portion with the particular values comprises programming the particular first value in a particular first redundant bit that is designed exclusively to store redundant information corresponding to the first particular bit.

25. The method of claim 22, wherein the another programming cycle occurs after completion of the initial programming cycle.

26. The method of claim 25, wherein the initial programming cycle completes upon a successful verification of a write to the first memory portion or upon a handling of a fault in the write to the first memory portion.

27. The method of claim 22, wherein the particular values are continuously accessible from the second portion of the OTP memory as long as the OTP memory is powered.

28. The method of claim 27, wherein the particular values are continuously accessible from the OTP memory without requiring a read address.

* * * * *